United States Patent
Cline et al.

(10) Patent No.: US 6,891,370 B2
(45) Date of Patent: May 10, 2005

(54) METHOD AND SYSTEM FOR THREE DIMENSIONAL PHASE UNWRAPPING

(75) Inventors: Harvey Cline, Niskayuna, NY (US); Siegwalt Ludke, Scotia, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/615,121

(22) Filed: Jul. 8, 2003

(65) Prior Publication Data

US 2005/0007115 A1 Jan. 13, 2005

(51) Int. Cl.$^7$ ................................................. G01V 3/00
(52) U.S. Cl. .................................... 324/307; 324/309
(58) Field of Search ................................ 324/307, 309, 324/306, 300, 312, 314

(56) References Cited

U.S. PATENT DOCUMENTS

| | | | |
|---|---|---|---|
| 4,797,615 A | 1/1989 | Rotem et al. ............... 324/309 |
| 5,783,942 A | * 7/1998 | Bernstein et al. ........... 324/306 |
| 6,150,973 A | 11/2000 | Pritt ............................. 342/25 |
| 6,208,416 B1 | 3/2001 | Huntley et al. ............. 356/374 |
| 6,445,182 B1 | * 9/2002 | Dean et al. .................. 324/309 |
| 6,703,835 B2 | * 3/2004 | Patch et al. ................. 324/307 |

* cited by examiner

Primary Examiner—Louis Arana
(74) Attorney, Agent, or Firm—Fletcher Yoder (57) ABSTRACT

In an alternate technique, a magnetic resonance imaging system comprises a set of gradient coils for producing controlled gradient field; a radio frequency coil for applying excitation signals to a subject of interest; a detecting coil for detecting magnetic resonance signals resulting from the excitation signals; and a control circuitry configured to energize the set of gradient coils, the radio frequency coil and to obtain a three dimensional phase wrapped image from the magnetic resonance signals detected by the detecting coils, and the control circuitry comprising a phase unwrap component to perform phase unwrapping in a volume of interest of the phase wrapped image to obtain a phase unwrapped image.

42 Claims, 5 Drawing Sheets

METHOD AND SYSTEM FOR THREE DIMENSIONAL PHASE UNWRAPPING

BACKGROUND OF THE INVENTION

The invention relates generally to imaging and other systems that process information including phase data, and more specifically to a method and system for three dimensional phase unwrapping for such systems, including particularly various magnetic resonance (MR) applications.

Phase information contained within received signals is used in several imaging applications to produce useful images. Synthetic Aperture Radar systems, for example use several scans from an airplane or a satellite to construct a topographic map of large areas of land. Other imaging applications which use phase based information include MRI, acoustic imaging, interferometry, and X Ray crystallography. Such phase information is also useful in optical Doppler tomography where the phase difference in the two received signals is used to measure the velocity of blood within a tissue.

Another application of phase information is for mapping the static fields required for MR processes. Homogeneous static fields are required for MR processes such as imaging (MRI) and spectroscopy (MRS). MR equipment maps the static field to determine the distribution of inhomogeneities which may then be corrected by using shim coils. Such mapping includes determining and correcting phase jumps in the static field.

One common problem encountered while mapping of fields in MR systems is phase wrapping. Phase wrapping refers to phase values of greater than 2Π or less than zero. It occurs because the measuring system measures values between 0 degrees and 360 degrees (2Π radians) and angles over 2Π are registered as the difference between actual angle and 360 degrees. Thus the measurement of field inhomogeneities results in "phase jumps" when there are phase angles greater than 2Π. Since the system only measures angles between zero and 2Π, a resultant phase angle between zero and 2Π may be "wrapped around" i.e. be a angle greater than 2Π. Determining whether a measured angle is in the range of zero to 2Π, or outside that range, and correcting out-of-range values is called phase unwrapping. Because algebraic manipulations of the phase map require continuity in the phase of measured signal, it is desirable to perform phase unwrapping, such as to correct field inhomogeneities in MR applications.

Currently, phase unwrapping methodologies undertake phase unwrapping in two dimensions only and consist of detecting pixel locations of the phase discontinuities, finding an ordering among pixel locations for unwrapping the phase, and adding offsets of multiples of 2Π. Phase unwrapping in images is often performed by computationally intensive, off-line systems under user guidance.

There is a need in the field for a fast, computationally efficient phase unwrapping methodology in three dimensions for correcting phase jumps for MR and other applications.

BRIEF DESCRIPTION OF THE INVENTION

Briefly, in accordance with one aspect of the invention, a method for three dimensional phase unwrapping for use in magnetic resonance imaging begins with selecting a voxel of interest from a plurality of voxels in a volume of interest of a magnetic resonance phase wrapped image. Neighboring voxels are then identified in a neighborhood of the voxel of interest. The voxel of interest has a known phase value and each of the neighboring voxels have a respective phase value, the difference of which from the neighboring voxels can be computed. The respective phase values of the neighboring voxels are adjusted to correct for phase jumps and, each of the neighboring voxels is assigned a respective adjusted phase value.

Respective absolute phase difference values corresponding to each of respective neighboring voxels are then determined and the respective absolute phase difference values are sorted to select a smallest absolute phase difference value. The voxel of interest is tagged as a visited (i.e. phase unwrapped) voxel and the neighboring voxels are similarly tagged. A new voxel of interest corresponding to the smallest absolute phase difference value is then selected and new neighboring voxels are identified in the neighborhood of the new voxel of interest. The above steps are then repeated in successive iterations until all voxels in the volume of interest have been phase corrected. The method also includes displaying a phase unwrapped image or other utilization of the corrected or adjusted phase map.

The invention also provides a system, as well as a computer program for carrying out such operations. In the system, a set of gradient coils produce controlled gradient fields; while a radio frequency coil applies excitation signals to a subject of interest and a detecting coil detects magnetic resonance signals resulting from the excitation signals. A control circuitry is configured to energize the set of gradient coils and the radio frequency coil. The control circuitry is also configured to obtain a three dimensional phase wrapped image from the magnetic resonance signals detected by a detecting coil and to convert it to a phase unwrapped image. The control circuitry comprises a phase unwrap component to perform phase unwrapping in a volume of interest of the phase wrapped image to obtain a phase unwrapped image.

The methods and systems for performing these three dimensional phase unwrapping may, of course be used in contexts other than MR imaging. Thus, any data sets including phase information that may be wrapped and that is usefully unwrapped may benefit from the present techniques.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF SPECIFIC EMBODIMENTS

Figure 1:
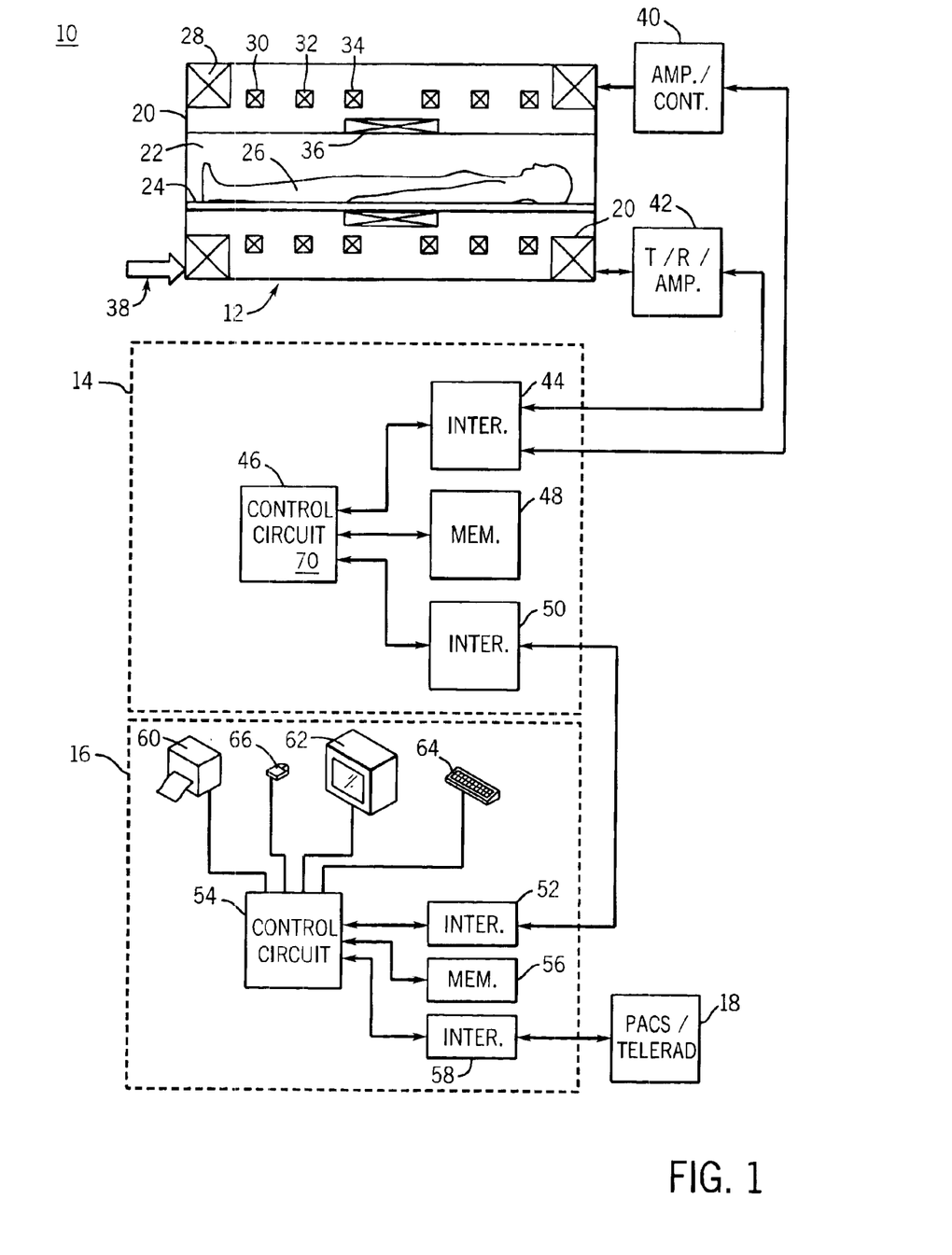
FIG. 1 is a schematic block diagram of an exemplary MR imaging system suitable for use with the present invention embodiments.

Referring to FIG. 1, a magnetic resonance imaging system 10 is illustrated schematically as including a scanner 12, a scanner control circuit 14, and a system control circuitry 16. System 10 additionally includes remote access and storage systems or devices as picture archiving and communication systems (PACS) 18, or other devices as teleradiology equipment. While the MRI system 10 may include any suitable scanner or detector, in the illustrated embodiment, the system 10 includes a full body scanner 12 comprising a housing 20 through which a bore 22 is formed. A table 24 is moveable into the bore 22 to permit a subject 26 to be positioned therein for imaging selected anatomy within the patient.

Scanner 12 includes a series of associated coils for producing controlled magnetic field and for detecting emissions from gyromagnetic material within the anatomy of the subject being imaged. Referring to FIG. 1, a primary magnet coil 28 is provided for generating a primary magnetic field generally aligned with the bore 22. A series of gradient cols 30, 32, and 34 permit controlled magnetic gradient fields to be generated during examination sequences. A radio frequency (RF) coil 36 is provided for generating radio frequency pulses for exciting the gyromagnetic material. While a separate receiving coil may be provided, in a present embodiment, the same RF coil 36 also serves to receive magnetic resonance signals from the gyromagnetic material during examination sequences.

The various coils of scanner 12 are controlled by external circuitry to generate the desired field and pulses, and to read emissions from the gyromagnetic material in a controlled manner. In the embodiment of FIG. 1, a main power supply 38 is provided for powering the primary field coil 28. Driver circuit 40 is provided for pulsing the gradient field coils 30, 32, and 34. Such circuit typically includes amplification and control circuitry for supply current to the coils as defined by digitized pulse sequences output by the scanner control circuit 14. Other control circuit 42 is provided for regulating operation of the RF coil 36. Circuit 42 will typically include a switching device for alternating between the active and passive modes of operation, wherein the RF coils transmits and receives signals, respectively. Circuit 42 also includes amplification circuitry for generating the RF pulses and for processing received magnetic resonance signals.

Scanner control circuit 14 includes an interface circuit 44 which outputs signals for driving the gradient field coils and the RF coil, and for receiving the data representative of the magnetic resonance signals produced in examination sequences. The interface circuit 44 is coupled to a control circuit 46. The control circuit 46 executes the commands for driving the circuit 42 and circuit 40 based on defined protocols selected via system control circuit 16. Control circuit 46 also serves to receive the magnetic resonance signals and performs subsequent processing before transmitting the data to system control circuit 16. The processing in control circuit 46 includes phase unwrapping using a phase unwrap component 70 which will be discussed in detail later. Scanner control circuit 14 also comprises one or more memory circuits 48 which store configuration parameters, pulse sequence descriptions, examination results, and so forth, during operation. Interface circuit 50 is coupled to the control circuit 46 for exchanging data between scanner control circuit 14 and system control circuit 16. Such data will typically include selection of specific examination sequences to be performed, configuration parameters of these sequences, and acquired data which may be transmitted in raw or processed form from scanner control circuit 14 for subsequent processing, storage, transmission and display.

System control circuit 16 comprises an interface circuit 52 which receives data from the scanner control circuit 14 and transmits data and commands back to the scanner control circuit 14. This interface circuit 52 is coupled to a control circuit 54 which may include a CPU in a multi-purpose or application specific computer or workstation. Control circuit 54 is coupled to a memory circuit 56 to store programming code for operation of the MRI system 10 and to store the processed image data for later reconstruction, display and transmission. Additional interface circuit 58 may be provided for exchanging image data, configuration parameters, and so forth with external system components such as remote access and storage devices 18. Finally, the system control circuit may include various peripheral devices for facilitating operator interface and for producing hard copies of the reconstructed images. In the embodiment illustrated in FIG. 1, these peripherals include a printer 60, a monitor 62, a keyboard 64 and an alternate input device such as a mouse 66.

Scanner 12 and the control circuit associated therewith produce magnetic fields and radio frequency pulses in a controlled manner to excite and encode specific gyromagnetic material within the subject and to sense the signals emanating from such material and creating an image of the material being scanned. In a specific example the scan may be done to obtain a phase map of the scanner itself to check for homogeneities of the magnetic field produced by the primary magnet coil 28.

Figure 2:
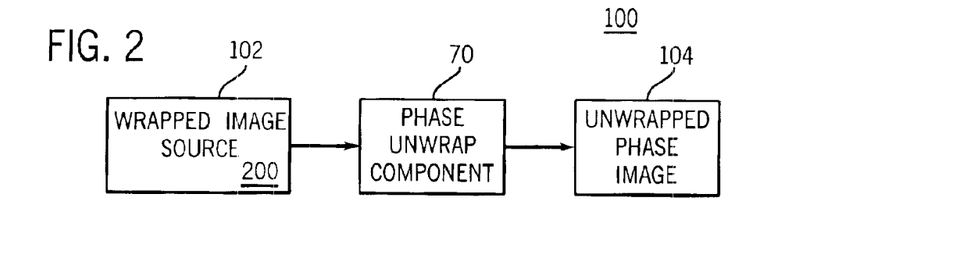
FIG. 2 is a schematic block diagram of a system comprising a phase unwrap component according to one embodiment of the invention.

FIG. 2 illustrates a system 100 for providing an unwrapped phase image 104 obtained via a system of the type illustrated in FIG. 1. It comprises a phase wrapped image source 102 configured to provide a phase wrapped image 200 including a volume of interest 202 within the phase wrapped image 200, and a phase unwrap component 70 configured to perform phase unwrapping in the volume of interest 202 of the wrapped image 200 to obtain a phase unwrapped image 104.

Figure 3:
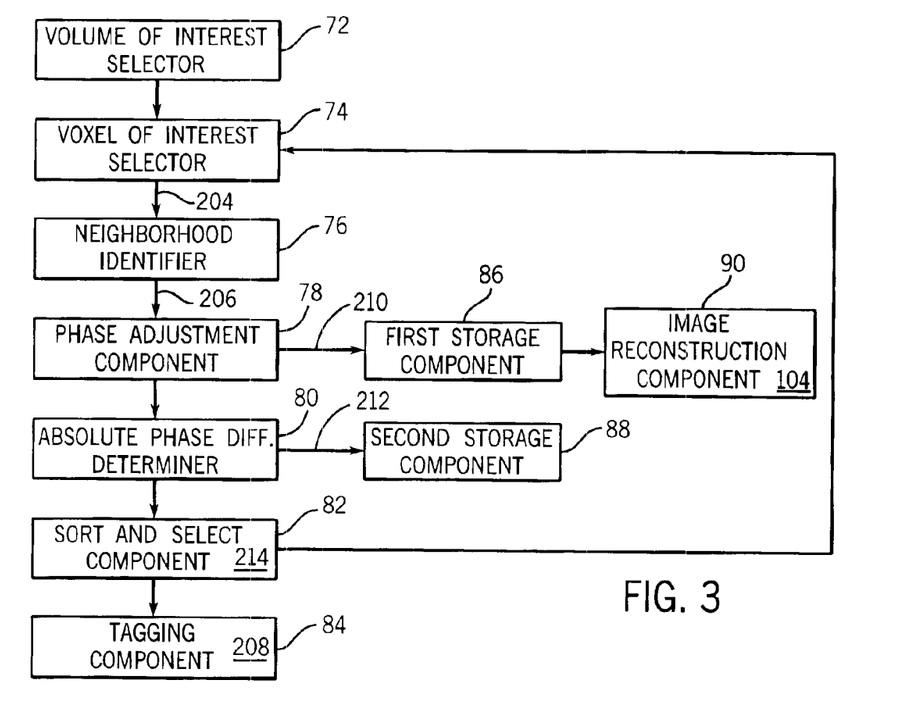
FIG. 3 is schematic block diagram of a phase unwrap component for use in the embodiments of FIG. 1 and FIG. 2.

The phase unwrap component 70 of FIG. 1 and FIG. 2 is illustrated in detail in FIG. 3. As illustrated, the component functionally comprises a volume of interest selector 72 to select the volume of interest 202 from the original phase wrapped image 200 obtained from the MR system 10 (or, more generally, from a wrapped image source 102). The technique employed to phase unwrap the wrapped image 200 in the phase unwrap component 70 may generally select all or some reduced portion of original image data, or multiple sections of a larger data set which may include phase jumps in need of unwrapping.

The phase unwrap component 70 further comprises a voxel of interest selector 74 to successively select voxels of interest 204 from a plurality of voxels in the volume of interest 200. Each voxel of interest 204 comprises a corresponding phase value. The phase unwrap component 70 additionally comprises a neighborhood identifier 76 to identify neighboring voxels 206 in a neighborhood of the voxel of interest, where each neighboring voxel comprises a respective phase value. As discussed below, based upon selected voxels of interest, neighboring (i.e. adjacent) voxels are identified for correction of their relevant phases. When a first voxel is not at a border of the volume of interest, the first voxel of interest will, of course, have 6 neighbors. Thereafter, as the phase unwrapped voxel population propagates in the volume of interest, successively selected voxels of interest will have fewer than 6 neighbors that have not already been phase unwrapped, until all voxels have been visited and phase corrected.

A phase adjustment component 78 receives the phase values from the voxel of interest selector 74 and neighborhood identifier 76 and undertakes computations to adjust the respective phase values of the neighboring voxels to correct for phase jumps. Here, each of the neighboring voxels is assigned a respective adjusted phase value 210. The various detailed functions of phase adjustment component are discussed in detail below with respect to FIG. 4.

The phase unwrap component 70 of FIG. 3, also includes an absolute phase difference determiner 80 to determine respective absolute phase difference values 212 corresponding to each of respective neighboring voxels 206. The respective absolute phase difference value 212 comprises an absolute difference between the phase value of each of the respective neighboring voxels 206 and the phase value of the voxel of interest 204 (i.e. the voxel which was of interest when the neighboring voxels were identified).

A sort and select component 82 is used to sort the absolute phase difference values and to select a minimum absolute phase difference value 214. A tagging component 84 is used to tag the voxel of interest 204 and the neighboring voxels 206 at an end of each iteration as visited voxels 208. As discussed below, while each voxel is phase corrected as it is identified as a neighbor of already-phase corrected voxels, the growing or propagating list of phase corrected voxels are analyzed in this manner to determine how to further propagate the phase-corrected voxel population efficiently.

The phase unwrap component 70 discussed hereinabove, is configured to undertake a plurality of iterations until all voxels in the volume of interest are phase-corrected and tagged as visited voxels 208. The voxel of interest selector 74 selects a new voxel of interest 204 in each iteration. In a present embodiment, the new voxel of interest 204 is selected by finding the phase-corrected voxel, that has not already been considered as a voxel of interest, and that has a minimum absolute phase difference value 214 as compared to other phase-corrected voxels that have similarly not been considered as a voxel of interest. That is, each voxel, once its phase has been corrected, becomes a candidate to become the voxel of interest. The voxel of interest, in each iteration, is the basis for further propagation of the population of phase corrected voxels. Thus, the voxel of interest selector 74 selects voxels of interest only once from the population of candidate voxels. Again, the phase unwrap component 70 is configured to exclude in successive iterations the neighboring voxels which have already been considered as voxels of interest.

The phase unwrap component 70 also comprises a first storage component 210 to store the voxels with adjusted phase values 210. It further comprises a second storage component 88 to store absolute phase difference values 212 (used as the basis for selecting appropriate voxels on interest for propagation of the corrected-voxel population). An unwrap image reconstruction component 90 may then be provided to reconstruct an unwrapped phase image 104 using the voxels stored in the first storage component 86.

Figure 4:
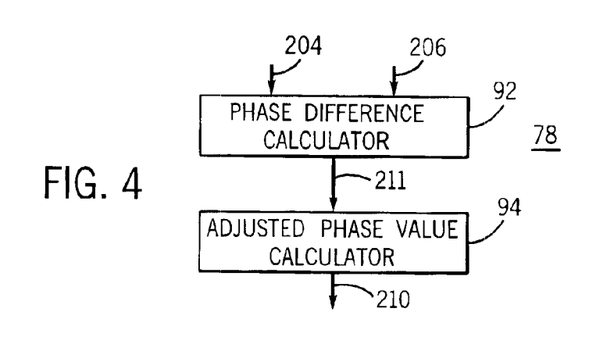
FIG. 4 is a schematic block diagram of a phase adjustment component for use in the embodiment of FIG. 3.

FIG. 4 illustrates various exemplary functional components of the phase adjustment component 78 which is used in phase unwrap component of FIG. 3. As will be understood by those skilled in the art, the phase adjustment component 78 can be used independently as well. The phase adjustment component 78 comprises a phase difference calculator 92 to calculate a phase difference value 211 for each respective neighboring voxel, where the phase difference value 211 is the difference in phase value of the respective neighboring voxel and the voxel of interest. An adjusted phase value calculator 94 is used to perform computations to correct phase values and obtain adjusted phase values 210. The computations comprise adding 2Π to the phase value of the neighboring voxel 206, if the respective phase difference value 211 corresponding to the respective neighboring voxel 206 is less than −Π; subtracting 2Π from the phase value of the neighboring voxel 206, if the respective phase difference value 211 corresponding to the respective neighboring voxel 206 is greater than Π; and making no change to the phase value of the neighboring voxel 206, if the respective phase difference value 211 corresponding to the neighboring voxels is between −Π to +Π.

Figure 5:
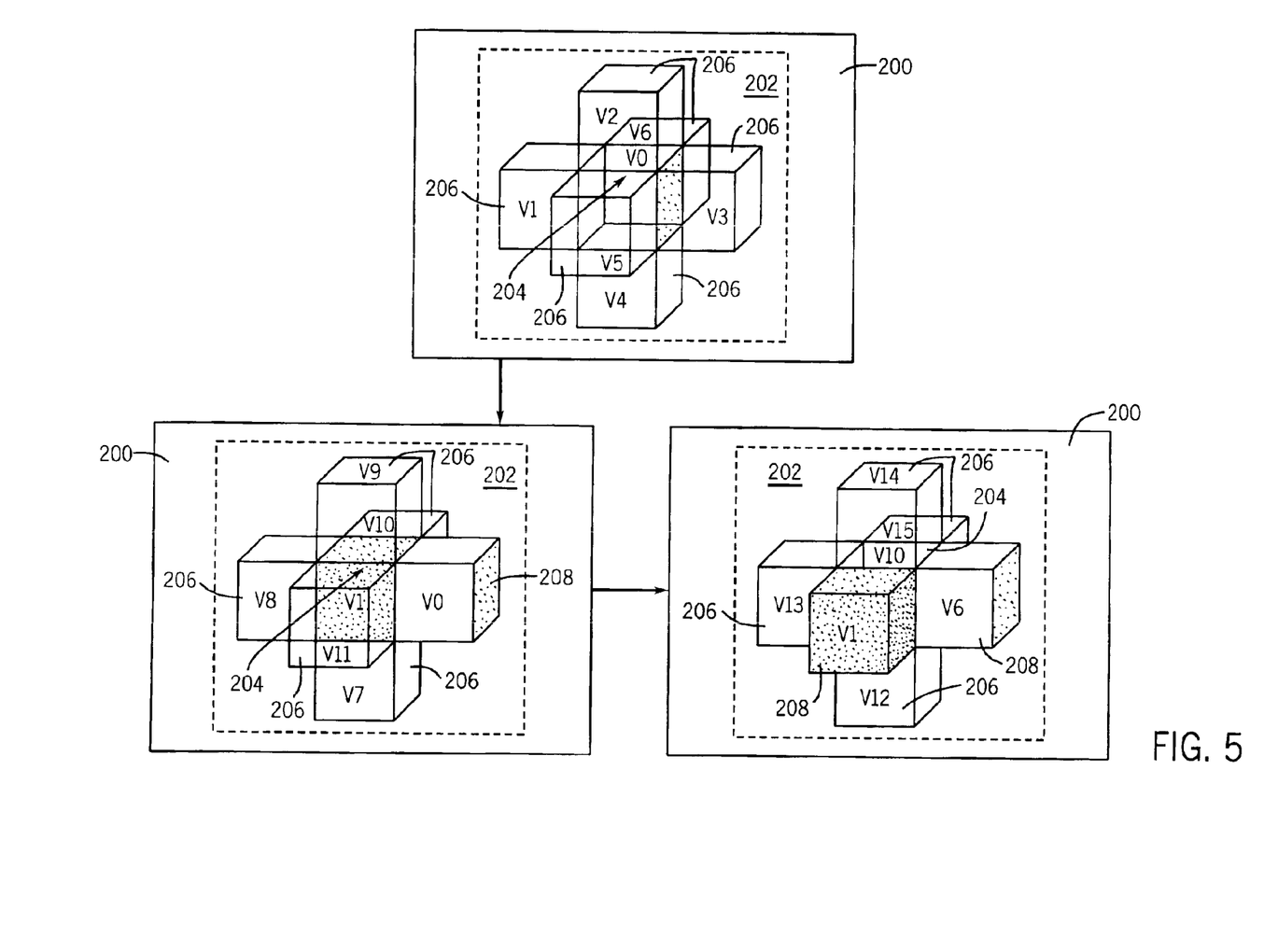
FIG. 5 illustrates the process of selection of voxel of interest and neighboring voxels in the embodiment of FIG. 3.

FIG. 5 illustrates an example of the voxel selection process being undertaken in the phase unwrap component of FIG. 3. Initially a volume of interest 202 is selected from a phase wrapped image 200, by the volume of interest selector 72. A voxel of interest 204 (V0) is selected at the center or a desired location in the volume of interest 202. Six neighbors 206 which are shown as V1, V2, V3, V4, V5 and V6 in FIG. 5 are selected in the neighborhood of V0 in the neighborhood identifier 76. The voxels are processed in the phase adjustment component 78 and their phase is corrected, as described above. The corrected values are stored in a first storage component 86. In parallel with the operations in phase adjustment component 78 or subsequently, the absolute phase difference values, i.e. the absolute difference between the phase value of Vo and phase value of V1, V2, V3, V4, V5 and V6 respectively, are computed in the absolute phase difference determiner 80, and stored in the second storage component 88. Based on the computations in the absolute phase determiner 80, the sort and select component 82, selects V1 as the next voxel of interest 204. As noted above, in a present embodiment, the selection of V1 is based upon that voxel having the corresponding minimum absolute phase difference with respect to V0. Subsequently, V0, V2, V3, V4, V5 and V6 are tagged as visited voxels 208.

In the next iteration, the neighborhood identifier 76 identifies a set of neighbors 206 in the neighborhood of V1 and these are V7, V8, V9, V10 and V11. It should be noted that once the phase of a voxel has been corrected, it need not be corrected again, and only neighboring voxels not already corrected (i.e. not tagged as visited) are added to the propagating population or corrected voxels. V7, V8, V9, V10 and V11 are processed similarly in the phase adjustment component 78 and absolute phase difference determiner 80, and one of the voxels not already considered as the voxel of interest, such as voxel V10, is selected as the new voxel of interest 204. The neighborhood identifier 76 then selects V12, V13, V14 and V15 as the neighbors 206 in the neighborhood of V10. As is seen from FIG. 5, V1 and V6 are not, at this stage, considered as candidates for the role of "voxel of interest" because they have already served that role for the propagation of the corrected voxel population. The process of selection of a new voxel and subsequent processing continues in this manner until all voxels in the volume of interest are tagged as visited voxels and their phase corrected. A phase unwrap image is thus created at the image reconstruction component 90 using the values stored in first storage component 86.

Figure 6:
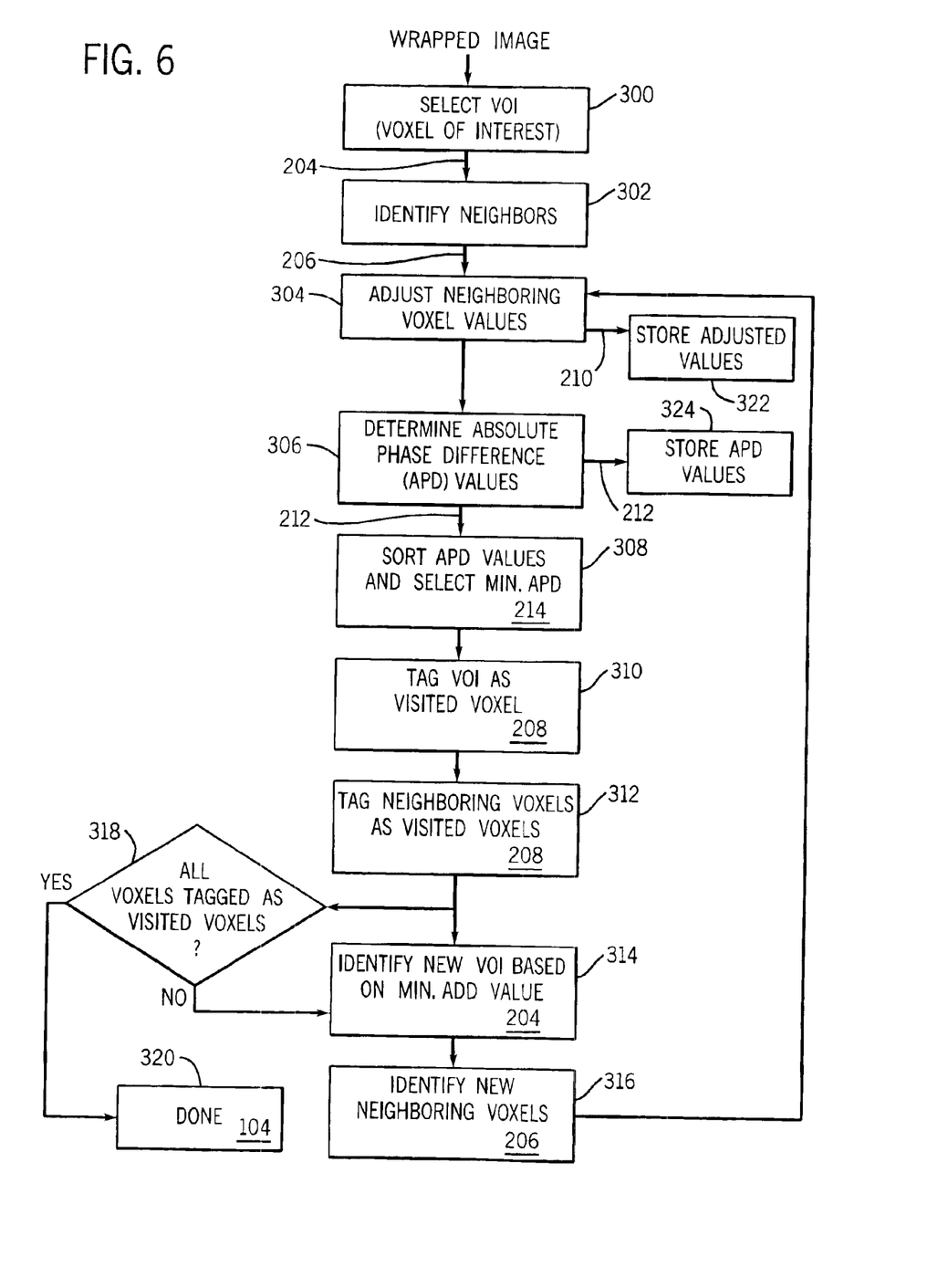
FIG. 6 is a schematic block diagram illustrating steps of exemplary logic used for conducting phase unwrapping in the embodiments of FIG. 3.

FIG. 6 summarizes the method discussed above for three dimensional phase unwrapping. The method illustrated in FIG. 6 also explains the logic for voxel selection discussed hereinabove and shown in FIG. 5. The method comprises selecting a voxel of interest 204 at 300 from a plurality of voxels in a volume of interest 202 of a magnetic resonance phase wrapped image 200. A further step is identifying neighboring voxels 206 at 302 in a neighborhood of the voxel of interest 204. The voxel of interest 204 has a predetermined phase value and each of the neighboring voxels 206 has a respective phase value. As a next step, the method includes adjusting the respective phase values of the neighboring voxels 206 at 304 to correct for phase jumps, wherein each of the neighboring voxels 206 is assigned a respective adjusted phase value 210. The method further includes determining respective absolute phase difference values 212 at 306 corresponding to each of respective neighboring voxels 206. Next steps include sorting the respective absolute phase difference values 212 at 308 to select a smallest absolute phase difference value 214. The respective absolute phase difference value comprises an absolute difference between the phase value of each of the respective neighboring voxel and the phase value of the voxel of interest.

As a subsequent or a parallel step the method includes tagging the voxel of interest 204 as visited voxel 208 at 310 and similarly tagging the neighboring voxels 206 as visited voxels 208 at 312. Next, the method further includes selecting a new voxel of interest 204 at 314 corresponding to the smallest absolute phase difference value 214, for further propagation of the population of phase-corrected voxels. In the next iteration, the method includes identifying new neighboring voxels 206 at 316 in the neighborhood of the new voxel of interest 204. The steps including phase adjusting, absolute phase difference determining, sorting and selecting, tagging and related steps are repeated in successive iterations until all voxels in the volume of interest 202 have been phase corrected and tagged as visited voxels 208. Here, the neighboring voxels are new neighboring voxels and the voxel of interest is the new voxel of interest in the successive iterations. In the final step, the method includes displaying a phase unwrapped image 104 at 320.

Figure 7:
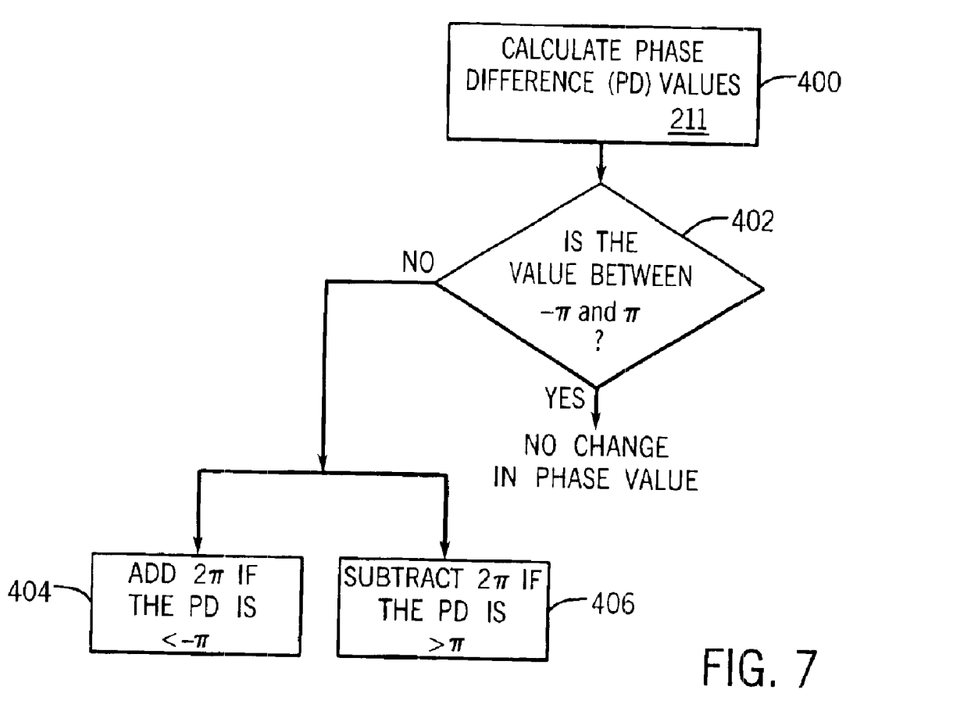
FIG. 7 is a schematic of a block diagram of a method for correcting phase wrapping in the process of FIG. 6.

The step of adjusting the neighboring voxels at 304 to correct for phase jumps is illustrated in detail in the flowchart of FIG. 7. It comprises calculating a phase difference value 211 for each respective neighboring voxel at 400. Here, the phase difference value 211 is the difference in phase value of the respective neighboring voxel 206 and the voxel of interest 204. Next step includes deciding whether the phase difference value 211 for each of neighboring voxels 206 is between −Π and +Π at 402. The correction process includes adding 2Π to the phase value of the neighboring voxel 206 at 404 when the respective phase difference value 211 as compared to the respective neighboring voxel 206 is less than −Π; subtracting 2Π from the phase value of the neighboring voxel 206 at 406 when the respective phase difference value 211 as compared to the respective neighboring voxel 206 is greater than Π; and making no change to the phase value of the neighboring voxel 206 at 408 when the respective phase difference value 211 as compared to the neighboring voxel 206 is between −Π to +Π.

Again, a first iteration in the method discussed hereinabove comprises selecting six neighboring voxels 206 in the neighborhood of voxel of interest 204. Also, selecting the voxel of interest 204 comprises selecting a respective voxel only once as the voxel of interest 204. Further, in successive iterations, the method comprises excluding adjusting phase values of the neighboring voxels 206 tagged as visited voxels 208. That is, each voxel may serve as the voxel of interest for the identification and correction of neighboring voxels only once, and each voxel so identified is only corrected once.

The method also includes storing the adjusted phase values 210 of the neighboring voxels 206 at 322 and storing the respective absolute phase difference values 212 at 324, which values are used in the present embodiment as the basis for selection of successive voxels of interest for propagation of the corrected voxel population.

The foregoing flow chart also shows the functionality and operation of the method and the system for three dimensional phase unwrapping for use in imaging applications. In this regard, each block/component represents a module, segment, or portion of code, which comprises one or more executable instructions for implementing the specified logical functions. It should also be noted that in some alternative implementations, the functions noted in the blocks may occur out of the order noted in the figures or, for example, may in fact be executed substantially concurrently or in the reverse order, depending upon the functionality involved. Also, one of ordinary skill in the art will recognize that additional blocks may be added. Furthermore, the functions can be implemented in programming languages such as C++ or JAVA; however, other languages can be used. In one example, the functions have been implemented using visual C++ 6.0 and a set of 63 images covering a head as the wrapped image 200 were unwrapped in 15 seconds on a 800 MHz personal computer.

The various embodiments and aspects of the invention described above comprise an ordered listing of executable instructions for implementing logical functions. The ordered listing can be embodied in any computer-readable medium for use by or in connection with a computer-based system that can retrieve the instructions and execute them. In the context of this application, the computer-readable medium can be any means that can contain, store, communicate, propagate, transmit or transport the instructions. The computer readable medium can be an electronic, a magnetic, an optical, an electromagnetic, or an infrared system, apparatus, or device. An illustrative, but non-exhaustive list of computer-readable mediums can include an electrical connection (electronic) having one or more wires, a portable computer diskette (magnetic), a random access memory (RAM) (magnetic), a read-only memory (ROM) (magnetic), an erasable programmable read-only memory (EPROM or Flash memory) (magnetic), an optical fiber (optical), and a portable compact disc read-only memory (CDROM) (optical).

Note that the computer readable medium may comprise paper or another suitable medium upon which the instructions are printed. For instance, the instructions can be electronically captured via optical scanning of the paper or other medium, then compiled, interpreted or otherwise processed in a suitable manner if necessary, and then stored in a computer memory.

The above embodiments and aspects of the invention have use in many imaging applications where the imaging systems construct images from phase information in received signals for example synthetic aperture radar (SAR) systems, Doppler tomography systems, MRI, acoustic imaging, interferometry and X ray crystallography.

While only certain features of the invention have been illustrated and described herein, many modifications and changes will occur to those skilled in the art. It is therefore to be understood that the appended claims are intended to cover all such modifications and changes as fall within the true spirit of the invention.

What is claimed is:

1. A method for three dimensional phase unwrapping for use in magnetic resonance imaging comprising:
   a) selecting a voxel of interest from a plurality of voxels in a volume of interest of a magnetic resonance phase wrapped image, wherein the voxel of interest has a predetermined phase value;
   b) identifying neighboring voxels in a neighborhood of the voxel of interest wherein each of the neighboring voxels has a respective phase value;
   c) adjusting the respective phase values of the neighboring voxels to correct for phase jumps, wherein each of the neighboring voxels is assigned a respective adjusted phase value;
   d) determining respective absolute phase difference values corresponding to each of respective neighboring voxels;
   e) sorting the respective absolute phase difference values to select a smallest absolute phase difference value;
   f) tagging the voxel of interest as visited voxel;
   g) tagging the neighboring voxels as visited voxels;
   h) selecting a new voxel of interest corresponding to the smallest absolute phase difference value;
   i) identifying new neighboring voxels in the neighborhood of the new voxel of interest;
   j) repeating steps c through i in successive iterations until all voxels in the volume of interest have been tagged as visited voxels, wherein the neighboring voxels are new neighboring voxels in the successive iterations and wherein the voxel of interest is the new voxel of interest in the successive iterations; and
   k) displaying a phase unwrapped image.

2. The method of claim 1, wherein adjusting the neighboring voxels to correct for phase jumps comprises:
   calculating a phase difference value for each respective neighboring voxel, wherein the phase difference value is the difference in phase value of the respective neighboring voxel and the voxel of interest;
   adding $2\Pi$ to the phase value of the neighboring voxel, if the respective phase difference value corresponding to the respective neighboring voxel is less than $-\Pi$;
   subtracting $2\Pi$ from the phase value of the neighboring voxel, if the respective phase difference value corresponding to the respective neighboring voxel is greater than $\Pi$; and
   making no change to the phase value of the neighboring voxel, if the respective phase difference value corresponding to the neighboring voxel is between $-\Pi$ to $+\Pi$.

3. The method of claim 1, wherein the respective absolute phase difference value comprises an absolute difference between the phase value of each of the respective neighboring voxel and the phase value of the voxel of interest.

4. The method of claim 1, wherein a first iteration comprises selecting six neighboring voxels in the neighborhood of voxel of interest.

5. The method of claim 1, wherein selecting the voxel of interest comprises selecting a respective voxel only once as the voxel of interest.

6. The method of claim 1 further comprising excluding adjusting phase values of the neighboring voxels tagged as visited voxels in successive iterations.

7. The method of claim 1 further comprising storing the adjusted phase values of the neighboring voxels.

8. The method of claim 1 further comprising storing the respective absolute phase difference values.

9. A phase unwrapped image created by the method of claim 1.

10. A method for iteratively adjusting phase values of voxels in a volume of interest of a three dimensional magnetic resonance phase wrapped image to correct for phase jumps comprising:
    selecting a voxel of interest in the volume of interest;
    identifying neighboring voxels in a neighborhood of the voxel of interest;
    calculating a phase difference value for each respective neighboring voxel, wherein the phase difference value is the difference in phase value of a respective neighboring voxel and the voxel of interest;
    adding $2\Pi$ to the phase value of the neighboring voxel, if the respective phase difference value corresponding to the respective neighboring voxel is less than $-\Pi$;
    subtracting $2\Pi$ from the phase value of the neighboring voxel, if the respective phase difference value corresponding to the respective neighboring voxel is greater than $\Pi$; and
    making no change to the phase value of the neighboring voxel, if the respective phase difference value corresponding to the neighboring voxel is between $-\Pi$ to $+\Pi$.

11. The method of claim 10, wherein successive iterations comprise selecting the voxel of interest based on a lowest absolute phase difference value.

12. The method of claim 10, wherein a first iteration comprises identifying six neighboring voxels in the neighborhood of the voxel of interest.

13. A phase unwrapped image created by the method of claim 10.

14. A magnetic resonance imaging system comprising:
    a set of gradient coils for producing controlled gradient field;
    a radio frequency coil for applying excitation signals to a subject of interest;
    a detecting coil for detecting magnetic resonance signals resulting from the excitation signals; and
    a control circuitry configured to energize the set of gradient coils, the radio frequency coil and to obtain a three dimensional phase wrapped image from the magnetic resonance signals detected by the detecting coils, and the control circuitry comprising a phase unwrap component to perform phase unwrapping in a volume of interest of the phase wrapped image to obtain a phase unwrapped image;
    wherein the phase unwrap component comprises:
    a volume of interest selector to select the volume of interest from the wrapped image;
    a voxel of interest selector to select successively voxels of interest from a plurality of voxels in the volume of interest, wherein each voxel of interest comprises a corresponding phase value;
    a neighborhood identifier to identify neighboring voxels in a neighborhood of the voxel of interest, wherein each neighboring voxel comprises a respective phase value;
    a phase adjustment component to adjust the respective phase values of the neighboring voxels to correct for phase jumps; wherein each of the neighboring voxels is assigned a respective adjusted phase value;

an absolute phase difference determiner to determine respective absolute phase difference values corresponding to each of respective neighboring voxels;

a sort and select component to sort the absolute phase difference values and to select a minimum absolute phase difference value; and a tagging component to tag the voxel of interest and the neighboring voxels at an end of each iteration as visited voxels, wherein the phase unwrap component is configured to undertake a plurality of iterations till all voxels in the volume of interest are tagged as visited voxels.

15. The imaging system of claim 14, wherein the voxel of interest selector selects a new voxel of interest in each iteration, wherein the new voxel of interest corresponds to the minimum absolute phase difference value selected by the sort and select component.

16. The imaging system of claim 14 further comprising a first storage component to store the voxels with adjusted phase values.

17. The imaging system of claim 16 further comprising an unwrap image reconstruction component to reconstruct an unwrap image using the voxels stored in the first storage component.

18. The imaging system of claim 14 further comprising a second storage component to store absolute phase difference values.

19. The imaging system of claim 14, wherein the neighborhood identifier identifies six neighboring voxels in a first iteration.

20. The imaging system of claim 14, wherein the phase adjustment component comprises:

a phase difference calculator to calculate a phase difference value for each respective neighboring voxel, wherein the phase difference value is the difference in phase value of the respective neighboring voxel and the voxel of interest; and an adjusted phase value calculator to perform computations to correct phase values, wherein the computations comprise:

adding $2\Pi$ to the phase value of the neighboring voxel, if the respective phase difference value corresponding to the respective neighboring voxel is less than $-\Pi$;

subtracting $2\Pi$ from the phase value of the neighboring voxel, if the respective phase difference value corresponding to the respective neighboring voxel is greater than $\Pi$; and making no change to the phase value of the neighboring voxel, if the respective phase difference value corresponding to the neighboring voxels is between $-\Pi$ to $+\Pi$.

21. The imaging system of claim 14, wherein the respective absolute phase difference value comprises an absolute difference between the phase value of each of the respective neighboring voxel and the phase value of the voxel of interest.

22. The imaging system of claim 14, wherein the voxel of interest selector selects respective voxel only once as the voxel of interest.

23. The imaging system of claim 14, wherein the phase unwrap component is configured to exclude in successive iterations the neighboring voxels tagged as visited voxels.

24. A system for providing an unwrap phase image comprising:

a phase wrapped image source configured to provide a phase wrapped image including a volume of interest within the wrapped image; and a phase unwrap component confined to perform phase unwrapping in the volume of interest of the wrapped image to obtain a phase unwrapped image;

wherein the phase unwrap component comprises:

a volume of interest selector to select the volume of interest from the wrapped image;

a voxel of interest selector to select successively voxels of interest from a plurality of voxels in the volume of interest, wherein each voxel of interest comprises a corresponding phase value;

a neighborhood identifier to identify neighboring voxels in a neighborhood of the voxel of interest, wherein each neighboring voxel comprises a respective phase value;

a phase adjustment component to adjust the respective phase values of the neighboring voxels to correct for phase jumps, wherein each of the neighboring voxels is assigned a respective adjusted phase value;

an absolute phase difference determiner to determine respective absolute phase difference values corresponding to each of respective neighboring voxels;

a sort and select component to sort the absolute phase difference values and to select a minimum absolute phase difference value; and a tagging component to tag the voxel of interest and the neighboring voxels at an end of each iteration as visited voxels, wherein the phase unwrap component is configured to undertake a plurality of iterations till all voxels in the volume of interest are tagged as visited voxels.

25. The system of claim 24, wherein the voxel of interest selector selects a new voxel of interest in each iteration; wherein the new voxel of interest corresponds to the minimum absolute phase difference value selected by the sort and select component.

26. The system of claim 24 further comprising a first storage component to store the voxels with the adjusted phase values.

27. The system of claim 24 further comprising a second storage component to store the absolute phase difference values.

28. The system of claim 26 further comprising an unwrap image reconstruction component to reconstruct an unwrap image using the voxels stored in the first storage component.

29. The system of claim 24, wherein the neighborhood identifier identifies six neighboring voxels in a first iteration.

30. The system of claim 24, wherein the phase adjustment component comprises:

a phase difference calculator to calculate a phase difference value for each respective neighboring voxel, wherein the phase difference value is the difference in the phase value of the respective neighboring voxel and the voxel of interest; and an adjusted phase value calculator to perform computations to correct phase values, wherein the computations comprise:

adding $2\Pi$ to the phase value of the neighboring voxel, if the respective phase difference value corresponding to the respective neighboring voxel is less than $-\Pi$;

subtracting $2\Pi$ from the phase value of the neighboring voxel, if the respective phase difference value corresponding to the respective neighboring voxel is greater than $\Pi$; and making no change to the phase value of the neighboring voxel, if the respective phase difference value corresponding to the neighboring voxel is between $-\Pi$ to $+\Pi$.

31. The system of claim 24, wherein the respective absolute phase difference values comprise an absolute difference between phase value of each of a respective neighboring voxel and the phase value of the voxel of interest.

32. The system of claim 24, wherein the voxel of interest selector selects a respective voxel only once as the voxel of interest.

33. The system of claim 24, wherein the phase unwrap component is configured to exclude in successive iterations the neighboring voxels tagged as visited voxels.

34. A computer readable medium for storing computer instructions for three dimensional phase unwrapping for use in imaging applications, the computer instructions comprising:
  a) selecting a voxel of interest from a plurality of voxels in a volume of interest of an image, wherein the voxel of interest has a predetermined phase value;
  b) identifying neighboring voxels in a neighborhood of the voxel of interest wherein each of neighboring voxels has a respective phase value;
  c) adjusting the respective phase values of the neighboring voxels to correct for phase jumps, wherein each of the neighboring voxels is assigned a respective adjusted phase value;
  d) determining respective absolute phase difference values corresponding to each of respective neighboring voxels;
  e) sorting the respective absolute phase difference values to select a smallest absolute phase difference value;
  f) tagging the voxel of interest as visited voxel;
  g) tagging the neighboring voxels as visited voxels;
  h) selecting a new voxel of interest corresponding to the smallest absolute phase difference value;
  i) identifying new neighboring voxels in the neighborhood of the new voxel of interest;
  j) repeating steps c through i in successive iterations until all voxels in the volume of interest have been tagged as visited voxels, wherein the neighboring voxels are new neighboring voxels in the successive iterations and wherein the voxel of interest is the new voxel of interest in the successive iterations; and
  k) displaying a phase unwrapped image.

35. The computer readable medium of claim 34, wherein computer instructions for adjusting the neighboring voxels to correct for phase jumps comprise:
  calculating a phase difference value for each respective neighboring voxel, wherein the phase difference value is the difference in phase value of the respective neighboring voxel and the voxel of interest;
  adding $2\Pi$ to the phase value of the neighboring voxel, if the respective phase difference value corresponding to the respective neighboring voxel is less than $-\Pi$;
  subtracting $2\Pi$ from the phase value of the neighboring voxel, if the respective phase difference value corresponding to the respective neighboring voxel is greater than $\Pi$; and
  making no change to the phase value of the neighboring voxel, if the respective phase difference value corresponding to the neighboring voxels is between $-\Pi$ to $+\Pi$.

36. The computer readable medium of claim 34, wherein the respective absolute phase difference values comprise an absolute difference between phase value of each of the respective neighboring voxel and the phase value of the voxel of interest.

37. The computer readable medium of claim 34, wherein a first iteration comprises selecting six neighboring voxels in the neighborhood of voxel of interest.

38. The computer readable medium of claim 34, wherein computer instructions for selecting the voxel of interest comprise selecting a respective voxel only once as the voxel of interest.

39. The computer readable medium of claim 34 further comprising computer instructions for excluding adjusting phase values of the neighboring voxels tagged as visited voxels in successive iterations.

40. The computer readable medium of claim 34 further comprising computer instructions for storing the adjusted phase values of the neighboring voxels.

41. The computer readable medium of claim 34 further comprising computer instructions for storing the respective absolute phase difference values.

42. A phase unwrapped image created by the computer instructions of claim 34.

* * * * *